United States Patent [19]

Prill

[11] 3,893,103

[45] July 1, 1975

[54] ELECTRICAL DRIFT CORRECTION SYSTEM

[75] Inventor: Robert S. Prill, West Paterson, N.J.

[73] Assignee: The Singer Company, Little Falls, N.J.

[22] Filed: Jan. 21, 1971

[21] Appl. No.: 108,348

[52] U.S. Cl. .................... 340/347 CC; 340/347 NT

[51] Int. Cl. ............................................ H03k 13/20

[58] Field of Search ........ 340/347 CC, 347 NT, 347

[56] References Cited

UNITED STATES PATENTS

| | | | |
|---|---|---|---|
| 3,070,786 | 12/1962 | MacIntyre | 340/347 |
| 3,105,230 | 9/1963 | MacIntyre | 340/347 |
| 3,316,547 | 4/1967 | Ammann | 340/347 |
| 3,421,093 | 1/1969 | Hinrichs et al. | 340/347 X |
| 3,475,748 | 10/1969 | Price et al. | 340/347 |
| 3,500,384 | 3/1970 | Naydan et al. | 340/347 |
| 3,506,818 | 4/1970 | Smith | 340/347 X |
| 3,541,320 | 11/1970 | Beall | 340/347 X |
| 3,541,446 | 11/1970 | Prozeller | 340/347 X |
| 3,566,265 | 2/1971 | Reid | 340/347 X |

OTHER PUBLICATIONS

Burr-Brown, "Handbook of Operational Amplifier Applications," 1963, pp. 45–46.

*Primary Examiner*—Charles D. Miller
*Attorney, Agent, or Firm*—T. W. Kennedy

[57] ABSTRACT

Analog to digital converter systems which include an integrator-comparator combination, utilizing operational amplifiers, often suffer from drift due to radiation and other causes. The drift can be effectively nulled out by means of a closed loop pulsed feedback circuit between the comparator and the integrator. The feedback circuit includes a capacitor which is charged or discharged in a pulsed manner to the required correction voltage during times other than actual measurement, such capacitor being coupled to that input of the operational amplifier integrator which is normally coupled to a point of reference potential, such as ground.

6 Claims, 3 Drawing Figures

INVENTOR
ROBERT S. PRILL

BY S. A. Giamatana
Thomas W. Kennedy
ATTORNEY

INVENTOR
ROBERT S. PRILL

BY S. A. Giarratana
Thomas W. Kennedy

ELECTRICAL DRIFT CORRECTION SYSTEM

BACKGROUND OF THE INVENTION

1. Field of the Invention

This invention relates to methods of and apparatus for self calibrating operational amplifers, and specifically, for balancing an integrator-comparator combination used in an analog to digital converter. More particularly, the invention relates to methods of and apparatus for developing drift correction techniques for an integrator-comparator combination. Accordingly, the general objects of this invention are to provide new and improved methods and apparatus of such character.

It is a primary purpose of this invention to develop a radiation hard, dual ramp, charge gated analog to digital converter system and, specifically, to develop a drift correction technique for an integrator-comparator combination which is considered to be at the heart of the analog to digital conversion process. However, the drift correction scheme described herein is general in nature, and can be applied advantageously to nonradiation environments.

Analog to digital converter systems which utilize semiconductor components, specifically transistors, operational amplifiers, diodes, etc., suffer severe accuracy degradation when subjected to high level radiation environments if not total degradation. Various hardening techniques (dielectric isolation) have been developed to substantially reduce the probability of total desctruction for a given level of radiation, however the degradation in such key parameters as gain, offset voltage, biascurrent, etc., still remain orders of magnitude more than that which can be tolerated in high accuracy A/D systems. This unpredictable degradation in the characteristic parameters of devices becomes of paramount importance in today's space age navigational equipment.

2. Description of the Prior Art

A major objection of prior drift and offset correction circuits is that a proliferation of critical field effect and bipolar transistor switches and complex open-before-close sequential switching and timing circuits were usually required. When a correction circuit was completed, instability often occurred; when opening the correction circuit; charge injection problems arose.

In an issued patent to Holland, U.S. Pat. No. 3,201,781, entitled "Analog to Digital Transducers," Aug. 17, 1965, a system is described wherein a feedback signal is produced having an amplitude related to the count of pulses taken during an analog to digital conversion, which feedback signal is compared with the applied signal to produce an error signal. However, there is no suggestion of how to correct for drift.

Although U.S. Pat. No. 3,449,741 entitled "Reversible Analog-Digital converter Utilizing Incremental Discharge of Series Connected Charge Sharing Capacitors" issued July 10, 1969 by Egerton, Jr. shows a circuit having one or more capacitors therein in connection with an analog to digital converter, again, there is no provision, however, for the correction of drift.

U.S. Pat. No. 3,445,839, entitled "Drift Corrections," issued May 20, 1969 to Engelberg et al., recognizes and states the problem of drift as:

"Any analog-to-digital" system such as an analog-to-digital converter or a DC digital voltmeter includes at least one analog circuit, i.e., a circuit responsive to signal amplitudes. These circuits may be DC amplifier amplitude comparator circuits, linear waveform generators such as ramp generators, etc. Furthermore, these circuits are energized by power supply voltages and are to a degree sensitive to the operating potentials provided by these power supply voltages. All of these circuits, if uncompensated, tend to drift in response to temperature as well as time. Component aging and ambient temperature sensitivity produce errors in the final digital readout. In particular, small percentage changes in the parameters of the analog circuits may introduce considerable errors in the digital result.

"Heretofore, in order to eliminate long time drift errors each of the analog circuits was provided with added compensation circuitry in the form of feedback or servo system, temperature compensating networks, direct-current to alternating-current converters in the form of "chopper" amplifiers and the like. If compensating circuitry were not employed then the circuits themselves were overdesigned to further delay the aging process and to maximize the range of ambient temperature to which the analog circuits were insensitive".

In the Engelberg patent, the signal input to an analog to digital conversion apparatus is alternately applied to a reference potential so that the apparatus can generate a correction factor in the form of a pulse count to change the number of pulses previously accumulated in a bidirectional counter during the analog to digital conversion process. The final count of the accumulated pulses is a corrected digital representation of the amplitude of a received signal. However, Engelberg et al, though they correct the digital output, to one quantization level fail to suggest how to correct for analog errors.

Schulz, U.S. Pat. No. 3,148,366, issued Sept. 8, 1964, describes an analog to digital apparatus in which an electric signal, representing an analog quantity, is used to modulate the width or duration of a train of pulses. A second train of pulses is gated into a counter under the time control of the modulated pulses for providing a digital result continuously representative of the analog quantity. A digital to analog circuit converts the modulated pulses into a feedback signal to compensate for systemic drift and other errors by a conditional feedback circuit. Disadvantageously, however, an additional high accuracy integrator is required; the correction accuracy of his drift correction circuit is dependent upon the integrator drift, necessitating an extremely accurate, almost "driftless" amplifier therefor. Under radiation environments the driftless amplifier would degrade and therefore the accuracy of the system would also degrade.

U.S. Pat. No. 3,316,751 to Burk, issued May 2, 1967, entitled "Electrical Measuring Apparatus," relates to apparatus for balancing an analog to digital converter. Such converters, according to Burk, are often plagued by drift over periods of time resulting from aging of circuit components, changes in power supplies or from a number of other factors. Previous schemes for rebalancing the bridge networks periodically, usually including servo systems which employ a reversible motor to adjust an impedance in a bridge network, were somewhat expensive to construct and required relatively long periods of time to rebalance the bridge network.

Burk proposes to provide a system which can be utilized to compensate for a drift in the bridge network as well as the zeroing of the analog to digital converter by measuring the output of the converter when no signal is being measured. This measured output represents the unbalance of the analog to digital converter or the unbalance of the combination bridge network and the converter, depending upon the system utilized. The measured output, which is in digital form, is converted into analog form and a zeroing signal representative thereof is applied to a biasing terminal in the input to the converter or to the bridge network, as desired. The zeroing signal then causes the output of the converter to go to zero in the absence of the signal to be measured.

The Burk patent recognizes that it is desirable to rebalance the measuring system at predetermined intervals to compensate for any drift that may take place in a bridge network, an amplifier, or a voltage to frequency converter. As described therein, this can be accomplished by means of a counter and a digital to analog converter. A relay actuated switch connects the output of the voltage to frequency converter when negative and positive, respectively, to the negative and positive inputs, respectively, of a bidirectional counter to thereby subtract or add, respectively, the error signal from the initial count registered by the counter. The digital output of the counter is converted to an analog error voltage of the digital to analog converter. The rebalancing by Burk can be performed at the end of the complete analysis or between the appearances of individual samples. The output of the counter is continuously converted to an analog error signal by the digital to analog converter. In a different embodiment, Burk, in lieu of a bidirectional counter in the feedback path, utilizes a unidirectional binary counter which must be reset at the start of the zeroing period so that the null is always approached from the same direction. In both embodiments, Burk suggests, without further explanation, that the digital to analog converter is biased to produce a positive analog output when the count registered on the counter is less than a predetermined value and to produce a negative analog output when the counter is greater than the predetermined value. The predetermined value is selected to provide suitable range on each side thereof and is advantageously the half full value.

Burk, in essence, couples the output of his voltage to frequency converter to a binary counter, through a digital to analog converter, back to his input. Thus, Burk requires a counter or a holding register to perform his corrections, register introduces quantization type errors.

There is no teaching in any of the foregoing prior art references to suggest the combination of two or more of them.

SUMMARY OF THE INVENTION

It is an object of this invention to provide new and improved methods of and apparatus for nulling operational amplifier and comparator combination.

Another object of this invention is to provide new and improved methods of and apparatus for drift and offset correction of an integrator comparator combination.

It is another object of this invention to provide a new and improved rate limited pulsed method of drift and offset correction with the minimum amount of extra circuitry as possible.

Another object of the invention is to use the correction loop to provide the integrator reset function.

Yet another object of this invention is to provide for new and improved methods of and apparatus for correcting for drift in an analog to digital converter which may be due to exposure to radiation environments.

Still another object of this invention is to provide for the drift correction of an integrator comparator combination, utilizing inherently hard or hardened semiconductor components.

Still another object of this invention is to provide for new and improved circuitry for correcting drift, which circuitry is electrically symmetrical, so that, to a first order of approximation, effects of leakage currents in the correction circuitry tend to cancel, thus providing for a more accurate system.

In accordance with one embodiment of this invention, methods of and apparatus for reducing drift in an operational amplifier having a first input adapted to be coupled to a source of analog signals to be converted and a second input adapted to be coupled to a point of variable reference potential and an output terminal for providing an output signal therefrom are set forth. This is achieved by the temporary coupling of the first input terminal to the point of reference potential, and by the feeding back of the output signal provided by the operational amplifier to the second input terminal in such a manner so that the output voltage is reduced towards a null level.

In accordance with another embodiment of the invention, improved methods of and apparatus for correcting for the drift and offset of an integrator-comparator combination in an analog to digital converter including feeding back the output of the combination through a correction network to an input thereof in a manner so as to cause the combination to be balanced is described. The scheme includes a means of detection when the combination is unbalanced in one direction and a means of charging and storing a pulsed charge of one polarity, the detection when the combination is unbalanced in the opposite direction and storing a pulsed charge of the opposite polarity, and the application of the stored charge to a second input terminal of the integrator.

In accordance with still another embodiment of this invention, methods of and apparatus for reducing the drift in an analog to digital conversion system including a serially connected operational amplifier-integrator and a comparator are set forth. During the A/D process the signal to be converted during those times when it is desired to convert such signal is coupled to the first input of the operational amplifier-integrator, and, during other times, coupling the one input to circuit ground. During the correction cycle the polarity of the comparator is detected and a series of clock pulses are gated into the correction capacitor. The capacitor is charged with a series of positive pulses when the comparator output is of one polarity, and it is charged in the opposite direction with a series of negative pulses when the comparator output is of a different polarity. When successive positive then negative pulses are gated into the capacitor the system has been nulled.

In a more specific embodiment of the invention, the offset and drift correction capacitor, is charged and discharged with a series of pulses by means of a level shifter circuit which is coupled to the output of the comparator. This level shifter circuit is adapted to provide logical levels of 0 and 1, respectively, on its two output lines when the comparator output is of positive polarity and to provide logical levels of 1 and 0, respectively, on the output lines when the comparator output is of negative polarity. A set of gating circuits, adapted to be operative during the correction time for the 0, 1 state receives clock pulses and one of said output lines. Another digital logic gate, adapted to be operative during the 1, 0 state, receives a series of clock pulses and the other of said output lines. The set of gating circuits provides a series of pulses of a fixed polarity when the comparator output is of one polarity and the logic gate provides a series of pulses of the opposite polarity when the comparator output is of a different polarity. A first diode means has its anode coupled to the source of bias potential and has its cathode coupled to a first junction terminal. A second diode means has its cathode coupled to the source of bias potential and has its anode coupled to a second junction terminal. A third diode means has its anode coupled to a third junction terminal and has its cathode coupled to the first junction terminal. A fourth diode means has its cathode coupled to a fourth junction terminal and has its anode coupled to the second junction terminal. A fifth diode means has its anode coupled to the third junction terminal and has its cathode coupled to one terminal of the capacitor. A sixth diode means has its cathode coupled to the fourth junction terminal and has its anode coupled to one terminal of the capacitor. A first and a second resistor couples the third and fourth junctions, respectively, to a negative voltage source, while a third and fourth resistor couples the second and third junctions, respectively, to a positive voltage source. First and second capacitive means couple the outputs of the two gating circuits, respectively, to the first and second junctions respectively.

DESCRIPTION OF THE CONVERTER SHOWN IN FIG. 1

Figures 1, 2:
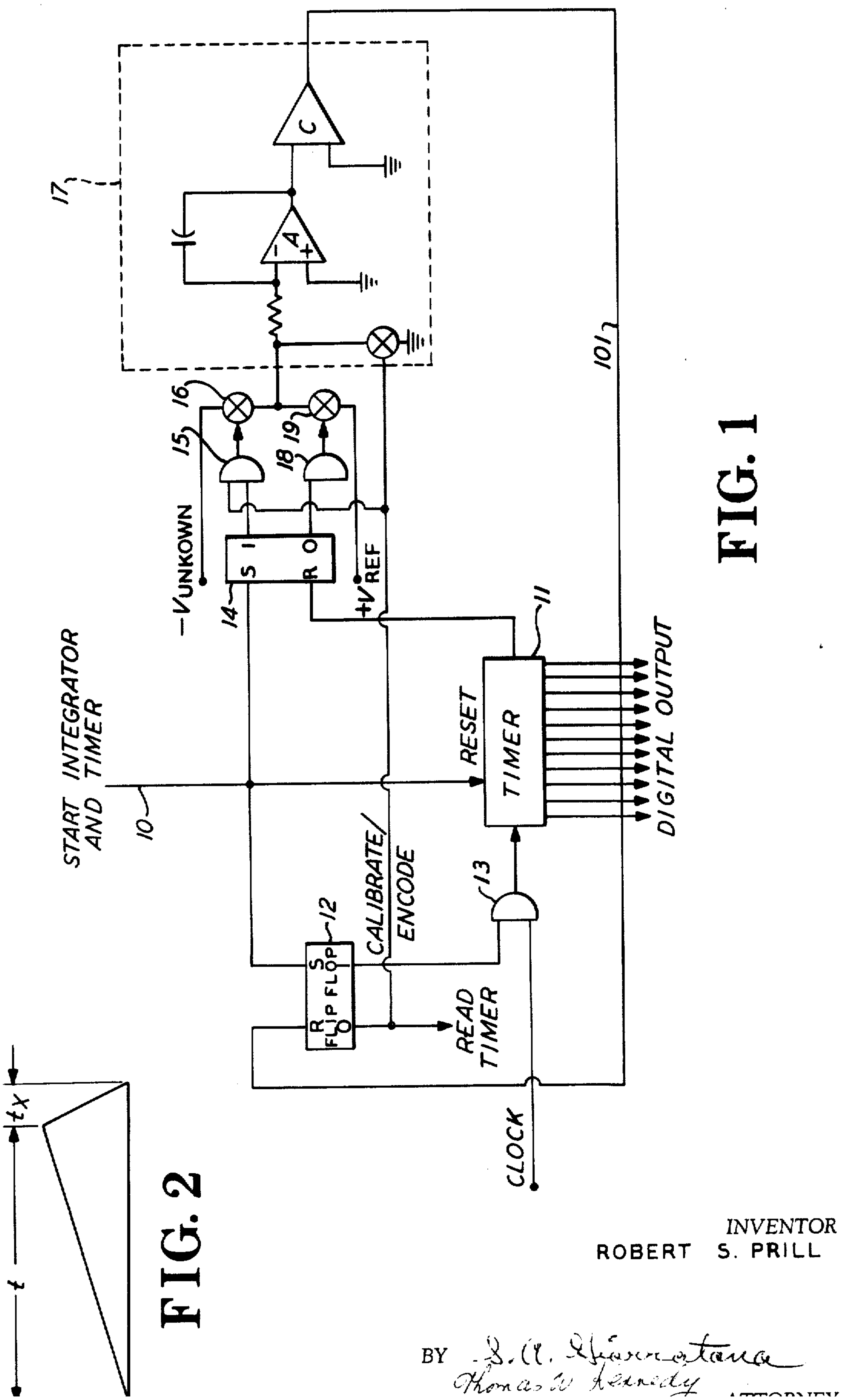
FIG. 1 is a block diagram of a dual ramp charge gated analog to digital converter, well known to the prior art, and includes an integrator-comparator combination enclosed in dotted outline.
FIG. 2 is a waveform, well known to the prior art, used to illustrate the principles of operation of the converter shown in FIG. 1.

Referring to FIG. 1, there is shown a dual ramp charge gated analog to digital converter, well known to the prior art. This drawing is illustrated, and the following immediate description is given, so that the reader is enabled to have a full understanding both of the invention and of the field and environment in which the invention is placed.

An unknown voltage source to be digitized, labelled in the drawing as −V unknown is integrated for a fixed time period as measured by the digital timer. After which a reference voltage of opposite polarity labelled as +V ref, which is scaled to be equal to or greater in absolute magnitude than the magnitude of any possible input signal, is gated to reset the integrator. The number of pulses accumulated in the timer before the integrator output crosses the comparator threshold voltage is a digital measure of the ratio of the unknown voltage to the reference.

A START INTEGRATOR AND TIMER pulse is applied to a line 10. The line 10 is coupled to reset a multi-stage binary counter which acts as a timer 11. The line 10 is also coupled to the set terminal of a flip-flop 12. The "1" output terminal of the flip-flop 12 is coupled to one input of a two-input AND gate 13. The other input of the AND gate 13 is coupled to receive a series of clock pulses, which may occur at one megahertz rate. The output of the AND gate 13 is coupled to the input of the timer 11.

In addition, the line 10 is coupled to the set terminal of a second flip-flop 14. The 1 output terminal of the flip-flop 14 is coupled into one input of an AND gate, 15. The 0 output of the flip-flop 12, known as the "Encode/Calibrate" command is fed into the second input of the AND gate, 15. The output of this AND gate is coupled to and controls an analog switch, 16. This switch gates the unknown signal into the analog section of the converter 17, when the 0 output of the flip-flop 12 is at a logical 0 level which is the encode level.

When the timer 11 becomes completely filled, due to the gated clock pulses, and "overflows," a carry bit pulse produced by the last stage of the timer 11 is coupled to reset the flip-flop 14. The flip-flop 14, when reset, opens the analog switch 16, and provides an enabling output level onto the 0 output line which is coupled to one input of an analog switch 19, through a gate 18. The enabling signal on the 0 output terminal from the flip-flop 14 causes the switch 19 to close so as to pass +V ref into the integrator-comparator combination 17 shown in dotted outline.

In operation, the dual ramp charge gated A/D converter, shown in FIG. 1, has two electronic switches or gates: one switch 19 is coupled to the positive reference voltage, the other switch 16 is coupled to the negative unknown voltage. Upon closing the switch for the unknown voltage, a ramp of voltage is applied to the input resistor R which causes a step of current to be applied of the negative input terminal of the operational amplifier A. The operational amplifier, in view of the feedback capacitor $C_f$, integrates and inverts the input so that by applying a negative unknown voltage or current step for a time period t thereto, a positive going linear ramp, is provided by the output thereof for that period of time $t$, as depicted in FIG. 2. Subsequently, upon opening the switch to the negative unknown voltage, and by closing the switch 19 to the positive reference voltage source, the output of the operational amplifier decreases rapidly in a negative direction linearly, as shown in FIG. 2, until the voltage ramp crosses the zero or ground level. During this linear discharge period, until the integrator output voltage waveform crosses the ground level pulses are accumulated in the timer and the time duration $t_x$ from its maximum excursion point to the ground level is measured and compared with the known signal integration time t. The ratio of time $t_x$ to the time $t$ is proportional to ratio of the unknown voltage to the reference voltage. Expressed mathematically:

$$V\text{ unknown} = -\frac{t_x}{t}(V\text{ ref})$$

Referring to FIG. 1, the timer 11 is initially reset to all zeros by the START INTEGRATION AND TIMER pulse applied on the line 10. The pulse also sets the flip-flop 12, thus opening the AND gate 13 so that clock pulses applied thereto can start pulsing and filling up the timer 11. Hence, while the integrator is charging, the timer 11 is continuously indexed by the series of clocked pulses applied to its input. The START INTEGRATION AND TIMER signal sets the flip-flop 14 so that the voltage is applied from the −V unknown through switch 16 and the resistor R through the operational amplifier A. The output of the operation amplifier A increases in voltage for a period of time $t$, at which time the timer 11 becomes completely filled with all 1's so that, upon the next index pulse, the timer 11 resets to zero, a carry bit pulse from the timer 11 is coupled to reset the flip-flop 14, closing the switch 16 and opening the switch 19 so that the reference source +V ref is coupled to the operational amplifier. Therefore, the positive output signal from the switch 19, being applied to the integrator-comparator combination 17, causes the charge on the integrator to decrease linearly. Referring to FIG. 2, there is shown a waveform indicative of the time it takes to charge the integrator for the maximum duration and the time it takes to discharge it. Referring to FIG. 2 the integrator charges for the period of time $t$, which time t corresponds to the time it takes for the timer 11 to become completely filled. The time $t_x$ is the time it takes for the integrator to be completely discharged. The comparator provides an output therefrom when the comparator becomes completely discharged, that is, when the comparator crosses the zero reference level. At that time, a pulse is provided from its output to reset the flip-flop 12.

Upon the resetting of the flip-flop 12, the gate 13 is closed so that the indexing of the timer 11 ceases. An output signal is provided from the flip-flop 12 on the 0 output terminal to read the quantity stored in the timer 11 and simultaneously reset the analog section. The quantity of clock pulses stored in the timer 11 is a digital representation of the analog voltage which was unknown.

The unknown voltage is expressed by the following mathematical expression:

$$V \text{ unknown} = -\frac{t_x}{t}(+V \text{ ref})$$

wherein $t_x$ represents the digital output of the timer 11, and $t$ represents the full capacity of the timer 11.

The foregoind description is considered to be well known to those skilled in the field of analog to digital conversion.

DESCRIPTION OF A PREFERRED EMBODIMENT

Figure 3:
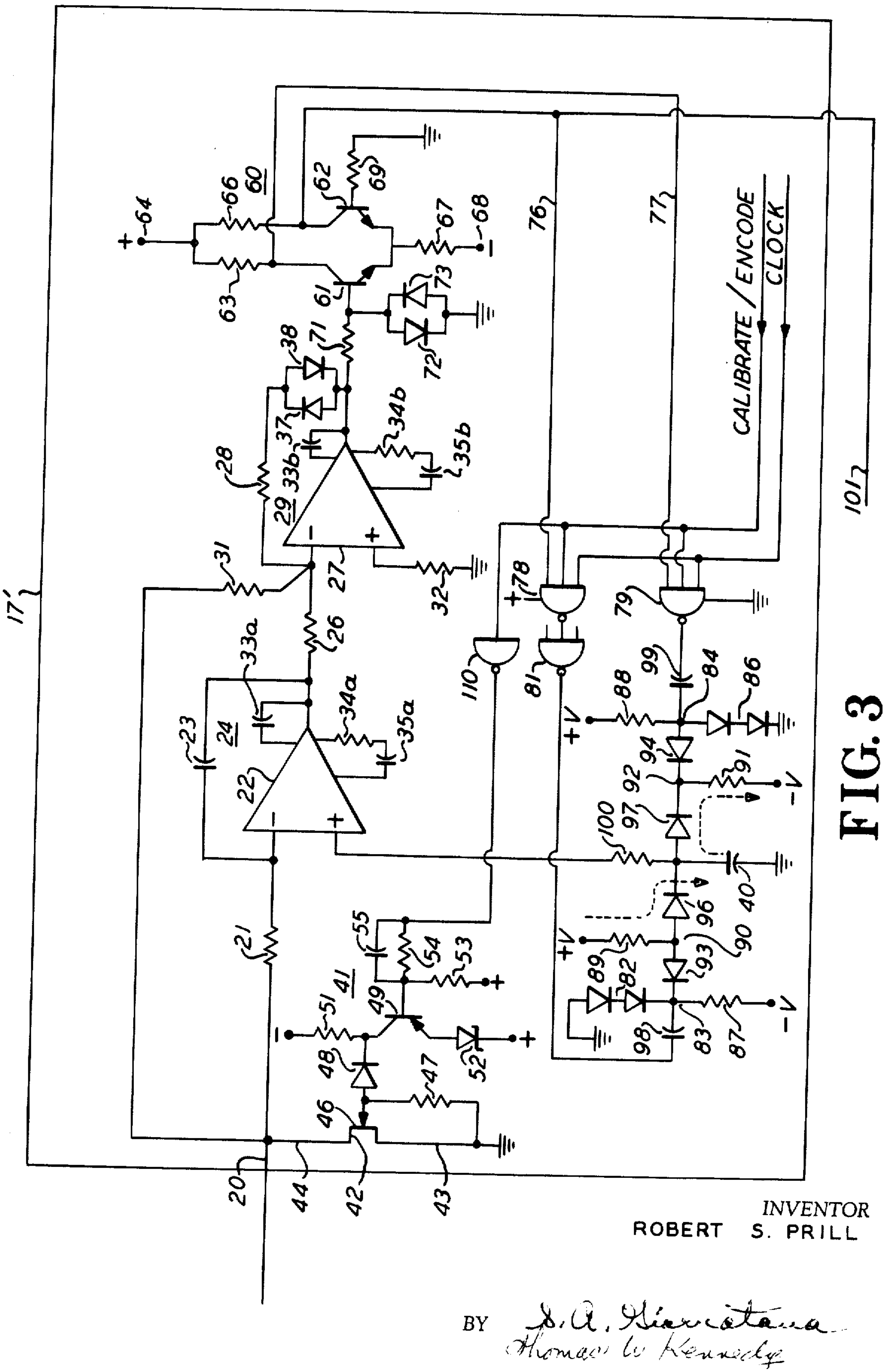
FIG. 3 is an electrical schematic of one embodiment of this invention illustrating an integrator-comparator combination together with drift correction circuitry therefor, which schematic can be substituted into the circuit for that portion of FIG. 1 enclosed by dotted outline.

Referring to FIG. 3, there is shown an electrical schematic of one embodiment of this invention, including an integrator-comparator combination together with a pulsed drift and offset correction circuit therefor.

The output voltage from the switches 16 and 19 (FIG. 1), representing either the analog unknown signal to be converted or the reference voltage, is connected to an input terminal 20 of an integrator-comparator and drift and offset correction circuit indicated in the dotted outline 17' of FIG. 3. The input terminal 20 is coupled by a resistor 21 to a negative input terminal of an operational amplifier 22. The output of the operational amplifier 22 is connected by a capacitor 23 back to its negative input terminal. The operational amplifier 22 and the capacitor 23 act as an integrator 24, in known manner. The output of the integrator 24 is coupled through a resistor 26 to a negative input terminal of an operational amplifier 27. The amplifier 27 has a resistor 28 coupled across its output and its negative input terminal. The operational amplifier 27 and the resistor 28 act as a comparator 29, in known manner.

A bias resistor 31 is connected between the input terminal 20 and the negative input terminal of the operational amplifier 27. A different bias resistor 32 is connected between a positive input terminal of the operational amplifier 27 and a point of reference potential, such as ground.

A capacitor 33*a* is connected between the output of the amplifier 22 and a coupling terminal therefor. A serially connected resistor 34*a* and a capacitor 35*a* are connected between the output of the amplifier 22 and a different coupling terminal therefor. Similarly, a capacitor 33*b* is connected between the output of the amplifier 27 and a coupling terminal therefor, and a serially connected resistor 34*b* and a capacitor 35*b* are connected between the output of the amplifier 27 and a different coupling terminal therefor. The components 33*a*, 33*b*, 34*a*, 34*b*, 35*a*, 35*b* are standard and are present for stability purposes.

In series with the resistor 28, coupled between the output of the amplifier 27 and its negative input terminal to form the comparator 29, is a pair of diodes 37, 38 coupled in parallel with each other in an opposing relationship. The resistor 28 and the diodes 37, 38 provide for unity gain feedback for large error voltages to the comparator 29 negative terminal and high gain for tiny voltages to the comparator negative terminal. Thus, when the integrator 24 provides a high level therefrom, the error with respect to ground or reference level is extremely large. Since, it is desired that the comparator operational amplifier 27 not saturate, it acts as a unity gain amplifier. In a unity gain mode, whatever appears at the negative input terminal of the amplifier 27 appears at the output terminal thereof, inverted at the same magnitude.

As a voltage applied at the negative input terminal of the amplifier 27 drops in value, that is, when it gets so small compared to ground (such as to the neighborhood of 20 millivolts or thereabouts) the diodes 37, 38 stop conducting; the amplifier 27 acts as an open loop amplifier, there being no feedback connected with it at that time. Hence, the gain of the amplifier 27 goes to approximately 20,000 instead of 1. Thus, the transitional point at which the output of the amplifier 27 crosses zero is sharply deliniated. The comparator 29 functions to determine the zero crossover.

With one of the diodes 37, 38 conducting, the output of the comparator 29 is approximately equal in magnitude to its input, so that, as the input voltage decreases towards zero, the output decreases towards zero. When the diodes 37, 38 cease to conduct, the operational amplifier 27 operates as an open circuit amplifier—not as a feedback amplifier—whereby the output is greatly magnified, enabling one to tell precisely when the zero or ground level is crossed.

Referring to FIG. 1, it is noted that the operational amplifier has its positive terminal directly connected to ground. However, referring to the embodiment shown in FIG. 3, the positive terminal of the operational amplifier 22 is not directly connected to ground, but, instead, through resistor 100, is coupled to one terminal of a capacitor 40, the opposite terminal of which is coupled to ground.

An input level shifter 41 is connected to the input terminal 20. The function of the input level shifter 41 is to couple the unknown analog signal or the voltage reference source to the input terminal 20 during those times when it is desired to measure the analog signal under consideration. At other times, when it is desired to calibrate, balance, or correct for drift, the input terminal 20 is effectively connected to ground by means of the input level shifter 41. The input level shifter 41 includes a field effect transistor 42 having its source electrode 43 connected to the point of reference potential, such as ground, and its drain electrode 44 connected to the input terminal 20. The gate electrode 46 is coupled via a gate-to-source resistor 47 to the point of reference potential. The gate electrode 46 of the field effect transistor 42 is coupled to the anode of a diode 48 whose cathode is coupled to the collector of a PNP transistor 49. The collector of the transistor 49 is also coupled by means of a resistor 51 to a negative potential source. The emitter of the PNP transistor 49 is connected to the anode of a Zener diode 52. The cathode of the Zener diode 52 is coupled to a positive polarity source. The positive polarity source is also coupled via a resistor 53 to the base of the PNP transistor 49. A parallel connected resistor 54 and a capacitor 55 are coupled to the base of the transistor 49 to receive a CALIBRATE signal which varies between a reference level of 0 volts to a reference level of +4 volts.

The input level shifter 41 operates as follows: With an input signal of +4 volts applied to the parallel connected resistor 54 and capacitor 55, the voltage applied to the base of the PNP transistor 49 is approximately +4 volts, sufficient to back bias the transistor 49 so that conduction does not occur. Since the transistor 49 does not conduct, the potential at its collector is fairly high in the negative direction. Thus, due to the high negative value at the collector of the transistor 49, current travels through the resistor 47 and the diode 48. In view of the voltage drop produced across the resistor 47, the voltage at the gate electrode 46 of the field effect transistor 42 becomes negative, thus turning the field effect transistor 42 off so that no conduction therethrough takes place. In view thereof, the input terminal 20 is effectively isolated from ground, and may convey the input signal applied thereto from either the gates 16 or 18 representing the analog signal to be converted or the reference signal, respectively, to the integrator-amplifier.

When the CALIBRATE signal changes to 0 volts so that the parallel connected resistor 54 and capacitor 55 are effectively connected to ground, current travels from the positive voltage source through the resistor 53 and the resistor 54, thus presenting a voltage drop across the resistor 53, thereby forward biasing the transistor 49.

With the transistor 49 forward biased, the transistor conducts, and current travels through the resistor 51, whereby the voltage at the collector of the transistor 49 goes from a high negative value towards ground. Thereupon, the diode 48 ceases to conduct, so that the potential at the gate electrode 46 of the field effect transistor 42 goes towards ground. Hence, the field effect transistor 42 conducts, so that the input terminal 20 effectively is connected to ground for the duration of the pulse applied to the resistor 54 and the capacitor 55.

An output level shifter 60 includes two NPN transistors 61 and 62. The collector of the transistor 61 is connected via a collector resistor 63 to a positive potential source at a terminal 64. Similarly, the collector of the NPN transistor 62 is connected by a collector resistor 66 to the positive potential source terminal 64. The emitters of the NPN transistors 61 and 62 are connected through a common emitter resistor 67 to a negative potential source at a terminal 68. The base of the NPN transistor 62 is connected via a base resistor 69 to a point of reference potential, such as ground. The base of the NPN transistor 61 is connected by means of a base resistor 71 to the output of the comparator 29. The base of the NPN transistor 61 is also coupled to a pair of parallel connected oppositely poled diodes 72 and 73 which are coupled to a point of reference potential, such as ground.

The output level shifter 60 operates as follows: A high voltage level of positive polarity from the output of the comparator 29, when applied to the base resistor 71, causes the resistor 71 to conduct. Current travels therethrough and through the diode 72 so that the base of the transistor 61 becomes slightly positive, causing the transistor 61 to be forwarded biased, so that the transistor 61 conducts. As the output from the comparator 29 drops to a very small voltage level so that the diode 72 does not conduct, the base of the NPN transistor 61 remains positive, so that the transistor 61 remains conducting. When the transistor 61 conducts, the voltage at the collector thereof drops to a low level, due to current conduction through the collector resistor 63. The conduction of the transistor 61 causes current to travel through the emitter resistor whereby the resistor 67 at the emitter junction is close to ground potential, thus preventing conduction by the transistor 62. Since the transistor 62 does not conduct, the collector thereof is maintained at a high positive level. Thus, with a positive output level from the output of the comparator 29, low and high voltage levels, respectively, will be provided from the collectors of the NPN transistors 61 and 62, respectively. These low and high voltage levels, respectively, remain at their values regardless of the magnitude of the output of the comparator 29 so long as the output thereof remains positive.

When the output of the comparator 29 crosses zero to a negative value, the base of the NPN transistor 61 becomes negative, and is limited to within a few volts of a negative voltage due to the voltage drop across the now conducting diode 73. The negative potential at the base of the NPN transistor 61 causes the transistor 61 to be backed biased so that conduction ceases to take place therethrough, whereby the collector of the NPN transistor 61 rises in value towards the potential at the terminal 64. At about the same time, since the transistor 61 ceases to conduct, the emitter resistor 67 tends to cease conduction, so that the potential at the emitter tends to become negative, thus, forward biasing the transistor 62. Thus, conduction takes place through the transistor 62. Due to conduction through the collector resistor 66, the voltage level at the collector of the transistor 62 drops at about the same time that the voltage level at the collector of the transistor 61 increases. As long as the voltage level from the comparator 29 is negative, regardless of magnitude, the output levels from the collectors of the transistors 61 and 62 remain high and low respectively.

Hence, when the output from the comparator 29 is high, a high level is provided on a line 76 connected to the transistor 62 collector, and a low level on a line 77 connected to the transistor 61 collector, whereas, when the output from the comparator 29 is negative, a low level is provided on the line 76 and the high level on the line 77. The line 76 is coupled to one input of a three-input gate 78. The line 77 is coupled to one input of a three-input gate 79. A CALIBRATE pulse, which goes from 0 to +4 volts, is coupled to a second input of both gates 78 and 79. A set of clock pulses which can range from 0 to +4 volts in magnitude, with a frequency of one megahertz, is coupled to the third input of the gates 78 and 79. The output of the gate 78 is serially coupled to another gate 81.

The gates 78, 79, 81 are of the inverting type and are so characterized that they provide a low level therefrom upon the simultaneous application of positive inputs to all of their input terminals, and high levels therefrom whenever a low level appears on any input.

The capacitor 40 charging and discharging circuitry includes a first diode means 82, such as a pair of diodes shown in FIG. 3 serially connected to provide for high voltage drops thereacross, wherein its anode is connected to a point of reference potential, such as ground, and its cathode is connected to a junction terminal 83. In somewhat of a similar fashion, a junction terminal 84 is connected to the anode of diode means 86, including a pair of serially connected diodes to provide for high voltage drops thereacross, with its cathode coupled to a point of reference potential, such as ground. The junction terminal 83 is coupled via a resistor 87 to a negative potential source −V whereas the junction terminal 84 is coupled by a resistor 88 to a positive potential source +V. The positive potential source +V is coupled via a resistor 89 to a junction terminal 90. Similarly, the negative potential source −V is connected by a resistor 91 to another junction terminal 92.

A diode 93 has its anode coupled to the junction terminal 90 and its cathode coupled to the junction terminal 83. Similarly, a diode 94 has its anode coupled to the junction terminal 84 and its cathode coupled to the junction terminal 92. Another diode 96 has its anode coupled to the junction terminal 90 and its cathode coupled to the one terminal of the capacitor 40. A diode 97 has its anode coupled to the one terminal of the capacitor 40 and its cathode coupled to the junction terminal 92. The output of the gate 81 is connected through a capacitor 98 to the junction terminal 83, while the output of the gate 79 is coupled via a capacitor 99 to the junction terminal 84.

Normally in the absence of a calibration command, diodes 96 and 97 are back biased because the anode potential on diode 96 is more negative than the capacitor 40 correction potential (normal range being 100 millivolts) due to the negative bias potential at node 83. The negative bias potential at this node is determined primarily by the ratio of R89 and R87, with two diodes in series 82 act as a clamp to insure that junction 83 stays at a fixed bias level.

Correction voltage is added to the capacitor 40 by an integration technique. The increment of voltage per correction pulse is determined by the width of the clock pulse, the magnitude of the capacitor 40, the resistor 89. For a positive logic transition at the output of gate 81 diode 93 will become back biased and diode 96 will become forward biased and current will flow from resistor 89 through diode 96 and into the capacitor 40 resulting in a positive ramp of voltage across the capacitor 40, lasting for the duration of the clock pulse. The loop during the second half of the clock period is given time to react to the new corrections voltage. If the lines 76 and 77 do not flip on the next clock pulse another pulse of current is added to the capacitor 40, and again an increment of voltage is added to the capacitors and again during the second half of the clock cycle the system is given time to react. If lines 76 and 77 flip, then during the next clock cycle current will be sucked out of capacitor 40. If lines 76 and 77 flip, then gate 79 will respond to the clock pulses and gate 81 will sit at a low level. In this condition, negative going pulsed at the output of 79, coupled by capacitor 97 to junction 84 will back bias diode 94 for the duration of the clock pulse. During this time current will be "sucked out" of capacitor 40 through diode 97 and resistor 91 resulting in a negative ramp of voltage. The correction voltage circuit will oscillate between these two states until such time as the calibration network is disabled by removal of the calibrate command.

During the measurement of an analog signal, the field effect transistor 42 does not conduct, so that the analog signal or the reference signal which is applied to the input terminal 20 is applied without any change in its status thereto. The integrator 24 integrates the signal applied to the input terminal 20 while the comparator 29 compares the output of the integrator 24 against a ground reference. The output from the comparator 29 is applied via the output terminal thereof to an output line 101 which is coupled to reset the flip-flop 12, (see FIG. 1) to indicate that a comparison has taken place. The gates 78 and 79 are inactive because the CALIBRATE signal is not applied to these gates units, during this mode.

DRIFT CORRECTION

At times when the converter is not normally performing an A/D conversion, i.e., during the "read timer" phase, it is desired to utilize this time to correct for drift or to "calibrate" the system. When the CALIBRATE signal is activated, i.e., when the read timer command is activated in FIG. 1, the input level shifter 41 through inverter gate 110, causes the field effect transistor 42 to conduct so that the input terminal 20 is coupled to ground. contemporaneously, the gates 78 and 79 are activated to permit the clock pulses to be applied in timed relationship thereto. The output from the integrator 24 should be at ground potential; however, assuming a positive error output from the integrator 24, the comparator 29 presents a negative output therefrom in view of its inverting action. The negative output from the comparator 29 causes a high level on the line 77 and a low level on the line 76. The high level on the line 77 together with the CALIBRATE signal, and clock pulses produce an output from the gate 79 in the form of a series of negative going clock pulses. Meanwhile, the output from the gate 81 is low because the output from the gate unit 78 is high. Hence, the gate 79 provides a series of negative going pulses, whereas the output from gate 81 remains low.

As the output from the integrator 24 remains high, the output from the comparator 29 remains low, so that a plurality of negative going pulses, are provided from the output of the gate 79. The negative going square wave pulses produced from the output of the gate 79 are differentiated and clipped due to the capacitor 99 and the diode means 86, whereby a series of negative going pulses, thus, are presented to the junction terminal 84. The series of negative going pulses at the junction terminal 84 cause the diode 94 to cease to conduct in a pulsed manner so that the potential at the junction terminal 92 decreases in a pulsating relationship therewith. Therefore, the diode 97 conducts, in a pulsed manner. Hence, as the gate 79 provides a series of pulses therefrom, the capacitor 40 effectively is pulsed in such a manner so that a series of negative charges are provided thereto.

Meanwhile, the output from gate 81 was quiescent, so that the junction point 83 remains undisturbed. Hence, the diode 93 remains conducting insuring that diode 96 remains back biased.

The capacitor 40 is negatively charged in pulsed steps until such time that the output level shifter 60 changes its state. In such a situation, the operational amplifier 22 provides a negative going signal from the output thereof so that the comparator 29 produces a positive signal, thus causing a high level to be provided on the line 76 and a low level on the line 77. Hence, with a high level on the line 76, a high CALIBRATE signal, and high clock pulses, pulsed low levels are provided from the buffer unit 78, so that pulsed high signals are provided by the buffer unit 81. Contemperaneously therewith, a low signal is applied on the line 77, so that the output from the buffer unit 79 remains high.

Hence, with a positive output signal from the comparator 29, a pulsating signal is provided from the gate 81 which is differentiated and clipped via the capacitor 98 and the diode means 82. This clipped signal appears at the junction terminal 83, and, periodically, causes the diode 93 to cease to conduct. This periodic cessation of conduction of the diode 93 causes the current to be periodically switched therefrom through to the diode 96 to positively charge the capacitor 40 in a pulsed manner.

Upon the change of state of the output level shifter 60, the tendency is for the charge on the capacitor 40 to be incrementally charged in the proper direction until the output level shifter 60 again changes its state. The output level shifter 60, at the desired balance point, shifts its state back and forth in synchronism with the system clock pulse. At such a point, when the output level shifter 60 flips back and forth or "bang-bangs," the integrator-comparator combination 17' is believed to be calibrated, and the circuit is ready for subsequent operation.

The electrical charge remaining on the capacitor 40, is of such value as to cause the operational amplifier 22 to be balanced in the proper direction so as to counteract any drift or error which has occurred, due to radiation or otherwise.

The resistor 32 functions to compensate for bias currents. The purpose of the resistors 26 and 31 is to cut down on transient levels and transient pulses which otherwise may be produced. On a theoretical basis, they have no other purpose for an understanding of this invention.

Various modifications may be performed without departing from the spirit and scope of this invention, such as incorporating several discrete components into one, as is common with integrated circuits and microelectronics. It is desired that this invention be construed broadly and that it be limited solely by the scope of the allowed claims.

What is claimed is:

1. Apparatus for reducing drift in an analog to digital conversion system including a serially connected operational amplifier-integrator and a comparator, said apparatus comprising:

means for coupling the signal to be converted, during those times when it is desired to convert said signal, to one input of said operational amplifier-integrator, and, during other times, coupling said one input to a point of ground potential;

means for deteting the polarity of the output of said comparator;

means for receiving a series of clock pulses;

a capacitor;

means, effective during said other times, for charging said capacitor with a series of positive pulses when said comparator output is of one polarity, and for charging in the opposite direction with a series of negative pulses when said comparator output is of a different polarity; and means coupling one terminal of said capacitor to a second input of said amplifier-integrator;

said means effective during said other times including:

A. a level shifter circuit coupled to the output of said comparator, and having a pair of output lines therefrom, said circuit being adapted to provide logical levels of 0 and 1, respectively, on said output lines when said comparator output is of positive polarity and to provide logical evels of 1 and 0, respectively, on said output lines when said comparator output is of negative polarity;

B. a first set of gating circuits, adapted to be operative during said other times, coupled to receive said series of clock pulses and one of said output lines;

C. a second set of gating circuits, adapted to be operative during said other time coupled to receive said series of clock pulses and the other of said output lines, one of said gating circuits including an inverting means so that, during said other times, said first set of gating circuits provides a series of pulses of a fixed polarity when said comparator output is of one polarity, and said second set of gating circuits provides a series of pulses of said fixed polarity when said comparator output is of a different polarity;

D. a reference of ground potential,

E. means for coupling said reference of group potential to the opposite terminal of said capacitor;

F. a first diode means having its anode coupled to said ground potential and having its cathode coupled to a first junction terminal;

G. a second diode means having its cathode coupled to said ground potential and having its anode coupled to a second junction terminal;

H. a third diode means having its anode coupled to a third junction terminal and having its cathode coupled to said first junction terminal;

I. a fourth diode means having its cathode coupled to a fourth junction terminal and having its anode coupled to said second junction terminal;

J. a fifth diode means having its anode coupled to said third junction terminal and having its cathode coupled to said one terminal of said capacitor;

K. a sixth diode means having its cathode coupled to said fourth junction terminal and having its anode coupled to said one terminal of said capacitor;

L. a first and a second resistor for coupling said first and fourth junctions, respectively, to a negative voltage source;

M. a third and a fourth resistor for coupling said second and third junctions, respectively, to a positive voltage source;

N. first capacitive means for coupling the output of one gating circuit to said first junction; and O. second capacitive means for coupling the output of the other gating circuit to said second junction.

2. In an anlaog to digital converter including an operational amplififer having a first input adapted to be coupled to a source of analog signals to be converted and a second input adapted to be coupled to a point of stored charge potential and an output terminal for providing an output voltage therefrom, a method for reducing drift of said operational amplifier comprising the steps of:

temporarily coupling said first input terminal to ground potential, determining the polarity of the output signal from said amplifier and providing a first indicative signal on one line when said polarity is positive and a second indicative signal on a second line when said polarity is negative, gating said indicative signals in a clocked pulse manner so that when an indicative signal is present on one of the said lines a positive charge is stored in a pulsed manner and when an indicative signal is present on the other of said lines a negative charge is stored in a pulsed manner, and coupling the stored charge potential to said second input terminal of the amplifier so that the output voltage is reduced towards a systems null level.

3. The method according to claim 2 wherein the step of determining the polarity of the output signal includes:

comparing the output signal from said amplifier with ground potential to provide a comparison signal of one polarity when the output signal of the amplifier is positive and a comparison signal of the opposite polarity when the output signal is negative.

4. In an analog to digital converter including an operational amplifier having a first input adapted to be coupled to a source of analog signals to be converted and a second input adapted to be coupled to a point of stored charge potential and an output terminal for providing an output signal therefrom, apparatus for reducing drift of said operational amplifier comprising:

means for temporarily coupling said first input terminal to ground potential, means for determining the polarity of the output signal from said operational amplifier including an amplifier coupled to recieve the ouput from said operational amplifier and having a first gain for output signals from said operational amplifier above a predetermined magnitude and a second higher gain for output signals from said operational amplifier below a predetermined magnitude to deliniate when the output of said operational amplifier crosses zero, means coupled to the output of said amplifier for feeding the output of said amplifier to said second input of said operattional amplifier in such a manner that the output voltage of said operational amplifier is reduced towards a system null level.

5. Apparatus according to claim 4 further including;

means coupled to the output of said amplifier included in said polarity determining means for providing a first indicative signal on one line when said polarity is positive and a second indicative signal on a second line when said polarity is negative, means coupled to said first and second lines for gating said indicative signals in a clocked pulsed manner so that when an indicative signal is present on one of said lines, a positive charge is stored in a pulsed manner and when an indicative signal is present on the other of said lines a negative charge is stored in a pulsed manner, and means for coupling the stored charge to said second input of said operational amplifier.

6. Apparatus as recited in claim 4 further comprising;

means coupled to the input of said amplifier included in said polarity determining means for comparing the output signal from said operational amplifier with a ground potential so as to provide a comparison signal of one polarity when the output signal of the operational amplifier is positive and a comparison signal of the opposite polarity when the output signal of the operational amplifier is negative;

means coupled to receive said comparison signals for providing binary signals on two different lines indicative of the two binary states 0 and 1 when said comparison signal is positive, and of the states 1 and 0 when said comparison signal is negative;

means for gating the binary signals on said different lines in a clock pulsed manner and when said comparison signal is one polarity, a positive charge is stored in a pulsed manner and when said comparison signal is of a different polarity, a negative charge is stored in a pulsed manner; and means for coupling the stored charge potential to the second input of the operational amplifier.

* * * * *